United States Patent [19]

Jaggi

[11] 4,336,523
[45] Jun. 22, 1982

[54] SUPERCONDUCTIVE SWITCHING AND STORAGE DEVICE

[75] Inventor: Rudolf Jaggi, Langnau, Switzerland

[73] Assignee: International Business Machines Corporation, Armonk, N.Y.

[21] Appl. No.: 154,547

[22] Filed: May 29, 1980

[30] Foreign Application Priority Data

May 29, 1979 [CH] Switzerland .................. 4980/79

[51] Int. Cl.³ ............... H03K 19/95; G11Q 11/44
[52] U.S. Cl. .................. 340/825.79; 365/160; 307/277; 307/306
[58] Field of Search .......... 340/166 SC; 365/160, 365/161, 162; 307/277, 306

[56] References Cited

U.S. PATENT DOCUMENTS

| | | | |
|---|---|---|---|
| 3,222,544 | 12/1965 | Cheng | 307/88.5 |
| 3,434,121 | 3/1969 | Gange | 365/160 |
| 3,452,333 | 6/1969 | Ahrons | 365/160 |
| 3,480,920 | 11/1969 | Newhouse | 365/160 |
| 3,491,345 | 1/1970 | Gange | 365/160 |

OTHER PUBLICATIONS

IBM Tech. Discl. Bull., vol. 5, No. 1, Jun. 1962, "Defining a S.C. Current Data", A. R. Brennemann.
L. A. Prozorova, Sowjet Physics, JETP 34, 9 (1958), R. A. Gange, Proc. IEEE 52, 1216 (1964).

Primary Examiner—Harold I. Pitts
Attorney, Agent, or Firm—Jackson E. Stanland

[57] ABSTRACT

A switching and storage device is described in which a superconductor is arranged in regard to a magnetic or magnetizable element so that the magnetic field of the element surrounds the superconductor. The inner inductivity of the superconductor is subject to strong variation if at least one lateral dimension of the superconductor is comparable with or smaller than the penetration depth of the field into the superconducting material. If the superconductor is bifurcated, an electric current of sufficient magnitude fed externally distributes to flow essentially in one branch while the other branch essentially remains currentless. External control by a magnetic field can switch the current into the other branch, i.e., the device is bistable. The switching process inherently is fast and of low power consumption.

17 Claims, 13 Drawing Figures

SUPERCONDUCTIVE SWITCHING AND STORAGE DEVICE

DESCRIPTION

1. Technical Field

The present device is a superconductive switch which is able to process electrical signals at high speed. The device requires little space and has small power consumption. It is particularly suitable for application in data processing machines.

2. Background Art

Various superconductive switching and storage devices are already known in the state of the art. One kind of such devices is the "Cryotron" as proposed by D. A. Buck (Proc. IRE, Vol. 44, page 482, 1956). In a cryotron device a superconductor is switched into the normal state by means of a magnetic field. In terms of modern data processing technology this is a "slow process". Also the power consumption of cryotron elements is considerable.

Another kind of superconductive device is based on the proposal by B. D. Josephson (Phys. Letters, Vol. 1, page 251, 1962) concerning the theoretical basis, as well as on the paper of J. Matisoo (Proc. IEEE, Vol. 55, page 172, 1967) demonstrating a practical device. Josephson elements are based on the phenomenon of electron tunneling. Electron tunneling through a thin layer in a cryogenic state can have two states that are influenced by the tunnel current as well as by an external magnetic field. One drawback of Josephson elements is their difficult manufacture. Particularly, the tunnel layer, which not only is very thin but also requires peculiar qualities, is not easy to produce. Although solutions to the manufacturing problems are beginning to show, it seems that this will remain an arduous process. Furthermore, Josephson elements, which generally are made in planar arrangements, require considerable substrate surface. This contrasts with the requirement of dense structures in which interconnection lines within a system of many elements should be as short as possible.

Like the Josephson element the element proposed here works without phase transition and therefore should be of comparable speed. Power consumption also is comparable to that of the Josephson element. The manufacture of the new element, however, is simple in comparison because in a planar structure the various layers can be made with no requirements that create any difficulty in the present state of the art. The space requirement of an element in planar arrangement is essentially small in comparison to that of a Josephson element.

The proposed element is based on the physical fact that the inner inductivity of a superconductor is a function of the magnetic field surrounding the conductor. This is due to non-linear properties of the superconductive material. The field dependence of the internal inductivity in the superconductive state is employed, i.e., in the state below the critical values for temperature, magnetic field and current. The effect is known in the literature as "Superinductance Amplification", cf. V. L. Newhouse, Applied Superconductivity, New York, San Francisco, London, 1975, pages 202-204 and the references indicated there.

Superconductive devices in which the inductivity of a conductor is controlled by a magnetic field have already been proposed, cf. U.S. Pat. No. 3,222,544 (Tsung-Hsin Cheng) as well as R. A. Gange, Proc. IEEE 52, 1216 (1964). The described class of devices, which Gange terms "Ryotron", differs basically from the device proposed herein. In these prior art devices the external inductivity of a superconductor is influenced by the magnetic field of an adjacent control conductor which is switched by an electric current from superconduction into normal condition. Dimensions of the conductors are large in comparison to the penetration depth of the external magnetic field. This current induced phase transition into normal conduction requires considerable switching power and works at relatively low speed.

In the present device, in contrast, all parts are in the superconducting state at all times. As non-linear theories of superconductivity predict (Ginzburg-Landau, Zh. Eksp. Theor. Fiz, 20, 1064, 1950), the order parameter and therefore the penetration depth $\lambda$ are dependent upon an applied magnetic field H. In extended homogeneous superconductors the influence of a magnetic field below the phase transition is small. However, in a superconductor of dimensions small in comparison to the penetration depth, the inner inductivity is expected to increase by several orders of magnitude before the critical field $H_c$ is reached. Experimental data concerning this effect were difficult to find in the literature. Nevertheless, the results of measurements made at 9.4 GHz are described by L. A. Prozorova in Sowjet Physics, JETP Vol. 34, page 9 (1958). A ratio of $\lambda$ (0.9 $H_c$)/$\lambda$ (0)$\simeq$5 was reportedly measured in tin-films of a thickness t$\simeq\lambda$ (0). These data show that the phenomenon is inherently fast and of sufficient magnitude. This is the phenomenon which the present invention employs.

SUMMARY OF THE INVENTION

A superconductive switching and storage device is described in which a superconductor is arranged in relation to a magnetic or magnetizable element so that the magnetic field of the element surrounds the superconductor. The inner inductivity of the superconductor is subject to strong variation if at least one lateral dimension of the superconductor is comparable to or smaller than the penetration depth of the field into the material of the superconductor. If the superconductor is bifurcated an external current of sufficient amount will distribute to flow essentially in one of the branches while the other branch remains essentially current free. External control by a magnetic field can switch the current from one branch into the other.

The invention will now be explained in detail by means of exemplificatory embodiments as depicted in the drawings.

BRIEF DESCRIPTION OF THE DRAWING

FIG. 1 shows the superconductive switch of this invention and illustrates the underlying principle of the switch.

FIGS. 10-12 show another embodiment of this switch, where FIG. 10 is a top view and FIG. 11 is a side view.

DESCRIPTION OF THE PREFERRED EMBODIMENTS

It is known that the inductivity of a superconductor depends upon the penetration depth. The internal inductivity $L_i$ of thin wires and film-shaped conductors in particular is $$L_i = \lambda^2 \cdot k, \tag{1}$$

wherein $\lambda$ is the penetration depth and $k$ a factor of proportionality. If an external magnetic field is applied the total inductivity L is the sum of a field-independent value $L_0$ and a term describing the field dependence. In a first approximation this is $$L = L_0 + \gamma H^2 + \ldots \tag{2}$$

To simplify the description, terms of higher magnitude are neglected. $\gamma$ is a tensor-component concerning the orientation of the field with respect to the current I. From (2) the magnetic flux $\phi$ can be determined as:

$$\phi = LI = I(L_0 + \gamma H^2). \tag{3}$$

This shows that the inductivity of a superconductor can be controlled by a magnetic field. There is a certain analogy to the transistor where in principle the resistance of a semiconductor is controlled by an electric field.

FIG. 1 shows a schematic view of a device which makes use of the described principle. The device consists of a superconductor 1 carrying a current I. An external magnetic field H which surrounds conductor 1 is generated, e.g., by a current flowing in conductor 2. Conductor 2 is isolated from conductor 1. It should be noted that numerous other geometric arrangements are possible. Conductors may consist of wires, strips or other forms. The cross-sections of the conductors may be constant or vary along their lengths, may have recesses, etc. The magnetic field H can have longitudinal as well as transverse components, i.e., parallel or orthogonal conductors may be used. The conductors may be stacked upon each other or arranged in a plane beside each other. The conductors may consist of type I or type II superconductors, which can be homogeneous or stratified. Also, superconductors in connection with normal conductors have a strongly field dependent penetration depth, cf. G. Deutscher and P. de Gennes: Superconductivity, Vol. 2, page 1029, (1969), edited by R. D. Parks. Superconductive devices of this kind can be used as amplifiers, switches for logic elements, storage elements and for numerous other functions of electronic circuits. The embodiment of a bistable switching device will now be described.

Figure 2:
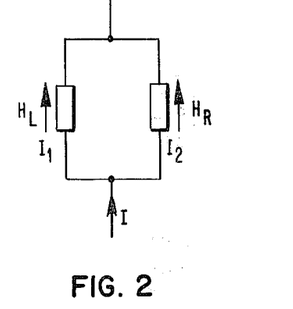
FIG. 2 shows two switches connected in parallel to make a bistable device.

FIG. 2 shows two field dependent conductors connected in parallel. The current I branches according to Kirchhoff's law:

$$I = I_1 + I_2. \tag{4}$$

It is now assumed that the left hand conductor is subject to an external magnetic field $H_1$ as well as to the field $H_2'$ of current $I_2$ which flows in the right hand conductor. Then, $$H_2' = I_2/b_2 \tag{5a}$$

whereby $b_2$ is a length which depends upon the geometric conditions. The total magnetic field influencing the left hand conductor is hence $$H_L = H_1 + H_2' = H_1 + I_2/b_2. \tag{5b}$$

Similarly, the right hand conductor is affected by the external magnetic fields $$H_2, \text{ and } H_1' = I_1/b_1, \text{ and} \tag{6a}$$

is subject to the total magnetic field $$H_R = H_2 + H_1' = H_2 + I_1/b_1. \tag{6b}$$

Equation (3) can now be applied to the parallel connection. For sake of simplicity, both inductivities $L_0$ are considered equal. Also, there is a field-independent mutual inductivity $M_0$. The arrangement is geometrically symmetric, i.e., $b_1 = b_2 = b$. Then $$L_0 I_1 + \gamma I_1(H_1 + I_1/b)^2 + M_0 I_2 = L_0 I_2 + \gamma I_2(H_2 + I_1/b)^2 + M_0 I_1. \tag{7}$$

Elimination of $I_2$ by insertion of (4) yields for $H_1 = H_2 = 0$ a third order equation for $I_1$. This equation has three real solutions:

$$I_0^* = I_1 = I_2 = I/2 \tag{8}$$

as well as $$I_{1,2}^* = \frac{I}{2} \pm \sqrt{\frac{I^2}{4} - \frac{(L_0 - M_0) b^2}{\gamma}} \tag{9a,b}$$

if the current $$I > I_D \tag{10}$$

wherein the discriminating current $I_D$ is given by $$I_D = 2b \sqrt{\frac{L_0 - M_0}{\gamma}}. \tag{11}$$

The inequality (10) means in words that the current I has to raise the original inductivity difference $L_0 - M_0$ by more than 100% in order for three real solutions to be possible. The calculation of magnetic energy shows that the solution (8) is unstable whereas the solutions (9a) and (9b) are stable.

The discriminating current $I_D$ is a critical value and, as is apparent from equations (10) and (11), the switching effect upon which this invention is based only appears if this value is exceeded. This is demonstrated by the computer simulation shown graphically in FIG. 3. The graph assumes that to the arrangement according to FIG. 2, i.e., the parallel connection of two closely coupled superconductors of small dimension, an ohmic resistance and a capacity are additionally connected in parallel. The capacity appears naturally in the circuit whereas the resistance is added artificially. If according to FIG. 3 a current I is applied that rises within $t = 2$ ps to 6.25 mA the currents $I_1$ and $I_2$ in the branches rise concurrently at the beginning until they reach the value $I_D=2\cdot 2.5=5$ mA. At this moment the circuit becomes bistable. By minute natural asymmetry $I_1>I_2$ and the curves branch out. The critical or discriminating moment is indicated by the vertical double line at the time $t\approx 3$ ps. As soon as the circuit has reached its stable state, i.e., when $t>5$ ps, then $I=I_1+I_2$. During the turn-on phase, in the example, as long as $t<5$ ps, the current $I_1+I_2<I$ and the current-difference flows into the condenser and through the ohmic resistance. As soon as $I_1$ and $I_2$ are constant, the resistance as well as the condenser become ineffective because, due to the superconductivity of the lines, any voltage across them has disappeared.

Figure 3:
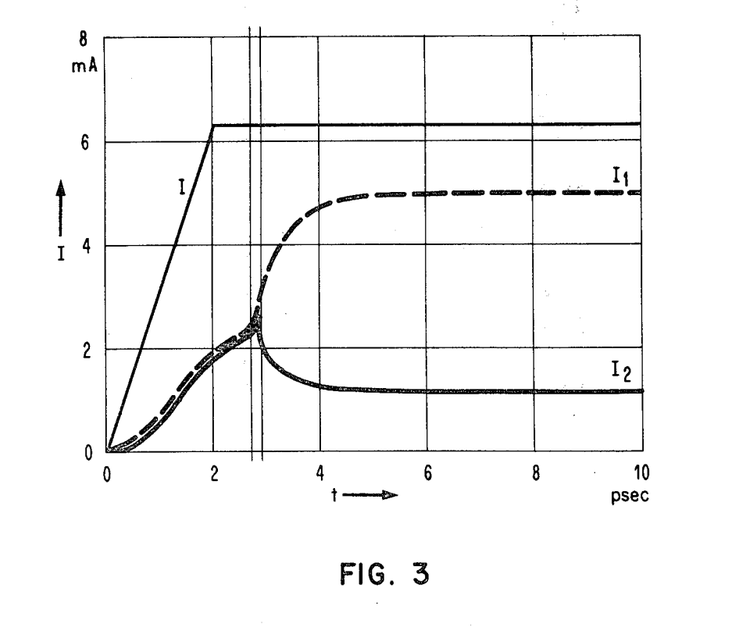
FIGS. 3-7 show various characteristic curves of this switch.
Figure 4:
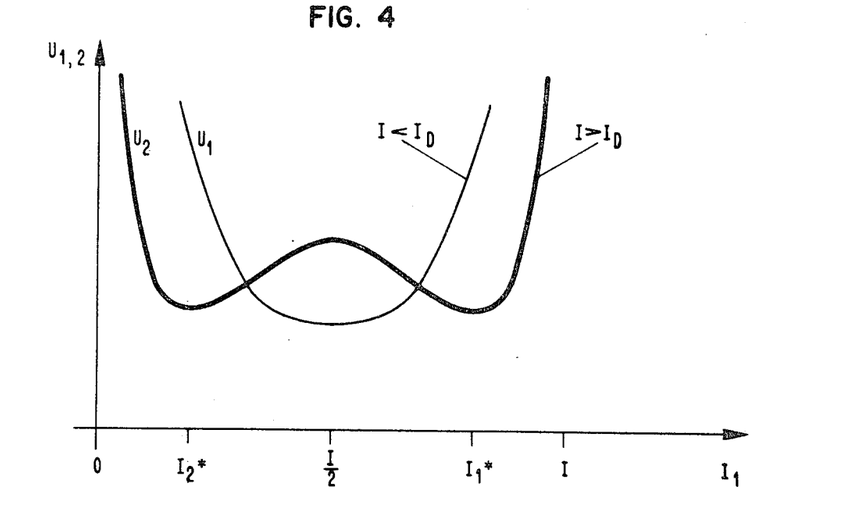

FIG. 4 depicts the energy function $U_{1,2}$ of the circuit both for the state $I<I_D$ as well as for $I>I_D$. In yhe first case $I<I_D$, half the current applied to the circuit flows through each branch. In the latter case, $I>I_D$, the current distribution is completely asymmetric as the device will assume one of the two minima of the current. This state prevails for $t>5$ ps in FIG. 3.

Figure 5:
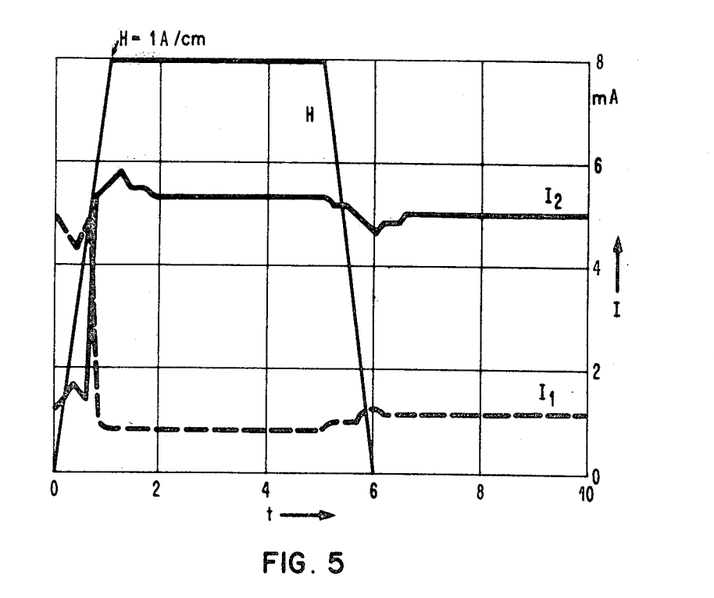

In this bistable state external magnetic fields $H_1$ and $H_2$ may be applied. In a first example, it is assumed that $H_2=-H_1=-H$. FIG. 5 shows the switching process. The bistable characteristic is obvious.

The drawing of FIG. 5 fits to that of FIG. 3 and is the continuation thereof to the right. The growing field H causes, besides some minor disturbances, a strong decrease of $I_1$ and a simultaneous increase of $I_2$. Thereafter the state is stable again and $I_1+I_2=I$ whereby now $I_2>I_1$, however. Turning off field H, which in this example happens at $t=5$ psec, again produces some minor disturbances only but does not influence the state of the device.

Figure 6:
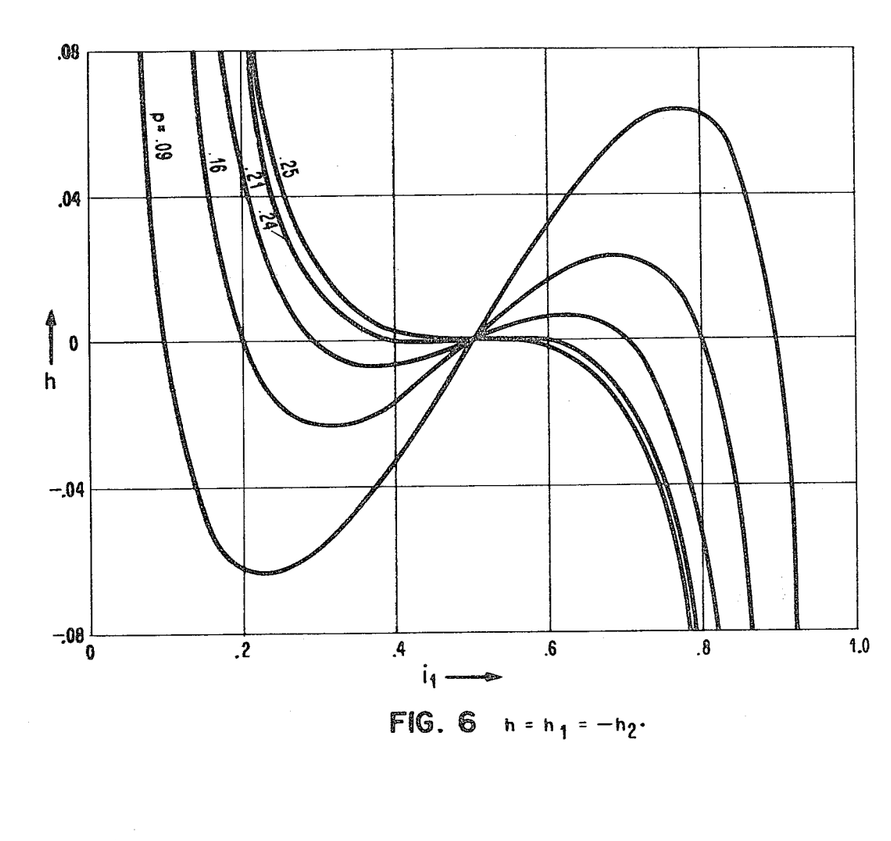

The equation (7) can be solved for H as function of $I_1$. FIG. 6 shows a computer simulation in which the normalized field.

$$h = \frac{b\cdot H}{I} \tag{12}$$

is plotted as a function of the normalized current $$i_1 = I_1/I \tag{13}$$

with different values of the parameter $$p = \frac{(L_0-M_0)b^2}{\gamma I^2} = \left(\frac{I_D}{2I}\right)^2. \tag{14}$$

The curves $H$-$I_1$ in this case are symmetric.

Figure 7:
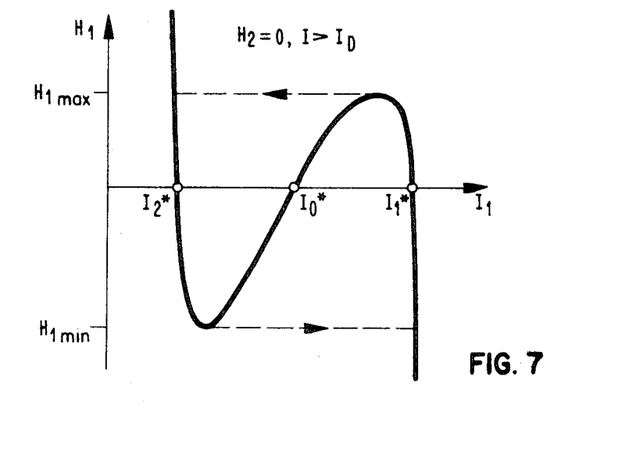

FIG. 7 shows an asymmetric switching characteristic for $H_1$ as a function of $I_1$ when $H_2=0$. If, starting at a value $I_1=I_1^*$, the magnetic field $H_1$ is increased from 0 past the value $H_{1max}$, the device switches along the dashed line to the left branch of the $H_1$-$I_1$ curve. If the field $H_1$ is now reduced to 0 the current remains stable at the value $I_2^*$. If the field $H_1$ is further decreased below the value $H_{1min}$, the device switches to the right hand branch of the $H_1$-$I_1$ curve. At $H_1=0$ the current assumes its initial value $I_1^*$. Since the complete switching process occurs in the superconducting state of the device and therefore there is no phase transition, the process is an inherently fast one. No power is consumed in the quiescent state.

Other examples with external field bias or with permanent circuit currents may be shown.

As a practical application a simple storage cell in planar technology will now be explained. This cell may find application as a storage element in a matrix.

Figure 8:
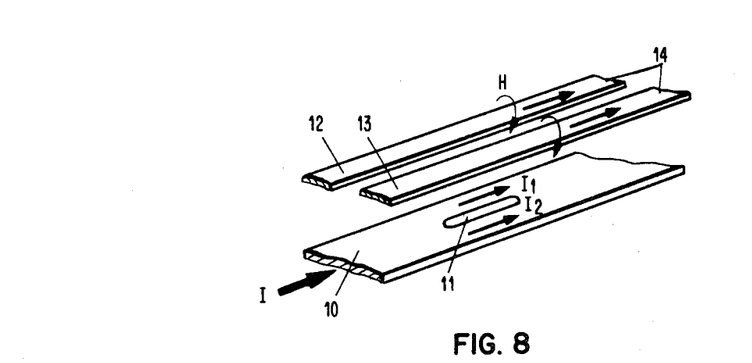
FIG. 8 shows a switch embodiment useful as a data store.

FIG. 8 shows the strip-shaped line 10 having a slot 11 therein, which e.g., is deposited in known ways on a substrate not shown in the drawing. The line 10 is covered by an insulating layer (not shown) which in turn supports strip lines 12 and 13. In contrast to the drawing the read/write lines 12 and 13 are arranged in close proximity above line 10 and cover the same in essence completely. The field H produced by read/write lines 12 and 13 is orthogonal to the current I and the currents $I_1$ and $I_2$ respectively in this emodiment.

If a current of sufficient amount $I>I_D$ flows through line 10 it will branch at the slot 11 and essentially flow on one side of the same. If a zero bit has to be written initially, a current will be sent through line 13 in the direction indicated by the arrow. The resulting magnetic field H will affect the path of $I_2$ and raise its inner inductivity more than that of the path $I_1$. Therefore, the state $I_1>I_2$ will result which is defined as signifying a zero bit. In a similar manner a one bit may be stored by sending a current in the direction indicated by the arrow through line 12. This current will cause $I_1<I_2$. To read out the stored information the ends 14 of lines 12 and 13 are interconnected. Switching off the current I through line 10 now induces a signal in the loop which consists of lines 12 and 13. The signal is sensed and evaluated in known ways by an amplifier. The polarity of the signal will indicate whether a zero bit or a one bit was stored in the device. This way of reading out information is destructive, which means that information must be rewritten if it is to be maintained. Procedures for rewriting information are well known in the art and need not be described here. The circuit can be arranged so the juxtaposed ends 14 of the two lines are grounded, i.e., connected to a ground plate. The other ends of the lines 12 and 13 are connected to a logic circuit which at read time detects the reading pulse which appears in symmetry to ground and at write time supplies the writing pulse required by either of the two lines and returning over the ground plate. Designing circuits of this kind is known to those skilled in the art and need not be described here in further detail.

Figure 9:
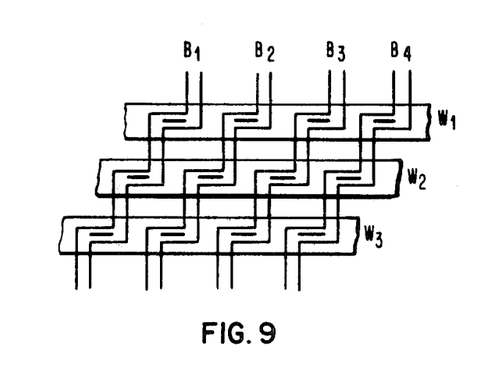
FIG. 9 shows a section of a storage matrix using the switch of FIG. 8.

FIG. 9 shows a multiplicity of cells according to FIG. 8 arranged in a storage matrix. The horizontal lines which correspond to line 10, FIG. 8, constitute the word lines W1, W2, W3, .... The diagonal lines, pairs of which correspond to lines 12 and 13 of FIG. 8, are bit lines of the storage matrix.

Figure 10:
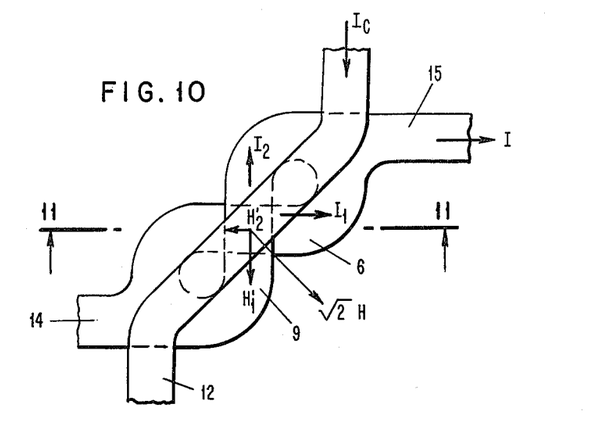
Figure 11:
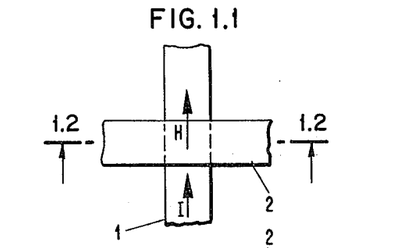
Figure 12:
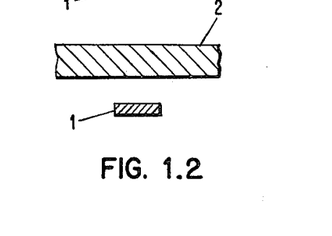

The second example, depicted by FIG. 10, shows another embodiment of the storage cell. FIG. 11 shows a cross-section of the device along line 11—11. The device, which has the geometric form of a figure "8" corresponds to the basic element of FIG. 1 in which the field H is parallel to the current I. To facilitate understanding FIG. 12 shows an enlarged exploded perspective view of the cell of FIG. 10. The diagonal control line 12 produces the external magnetic field in the desired direction. Various layers of the planar arrangement have the same reference numerals in FIG. 10 and in the cross-section of FIG. 11.

On the substrate 4, FIG. 11, an insulating layer 5 is arranged which supports the bottom branch 6 of the bifurcated superconductor arranged in a figure "8" loop. The other branch 9 is arranged on top of isolation 13 within a recess of the first branch. Both are covered by isolation layer 8 which in turn supports the read/write line 12. The ends 14 and 15 to which the current I is fed unite the two branches 6 and 9 of the superconductor.

Figure 13:
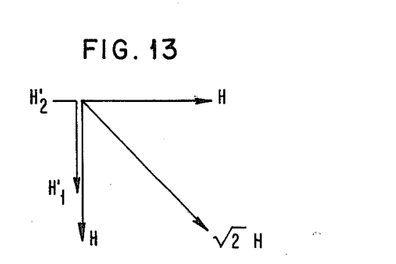
FIG. 13 shows a vector diagram of the magnetic field components in the switch of FIGS. 10-12.

FIG. 13 shows the vector composition of the magnetic fields in the cell according to FIGS. 10–12. The state of the cell as depicted is $I_1 > I_2$. At the cross-section of the two branches $I_1$ produces the magnetic field $H_1'$ which is orthogonal to $I_1$. In FIG. 12 the field points downwards because the respective branch is the bottom one and the field component above it acts upon the other branch. The small current $I_2$ is contrast produces the field $H_2'$ underneath the conductor. The control current $I_c$ which flows through the diagonal line produces a field $\sqrt{2} \cdot H$ with the effective components H. The components add up to $H_1' + H$ as well as $H_2' + H$ whereby in this example $H_1' + H > H_2' + H$. Accordingly, the device will switch. If, however, $I_c$ flows in the opposite direction there is no switching to the state $I_1 < I_2$ as is easily deduced from FIG. 13.

Manufacture of this second embodiment is somewhat more complicated in comparison to the embodiment of FIG. 8. It has, however, the advantage of requiring one single read/write line only. It therefore requires somewhat less substrate surface.

The devices described here can be made of practically all superconductive materials, such as lead, indium, and tin, as well as their alloys. Since the penetration depth $\lambda$ and the value $\gamma$ which describes the field dependence of $\lambda$ are material-dependent values one will choose the material in consideration thereof. Tin, lead, and lead-indium alloys have proved to be advantageous materials.

It is essential for this invention that in a bifurcated superconductor a current distributes asymmetrically upon the two branches which magnetically are mutually coupled if at least one lateral dimension of the branches is smaller than or comparable to the penetration depth and if the current exceeds a discriminating value. The bifurcated coherent conductor can be constituted by branching and reuniting, or by forming an aperture, e.g., a slot or hole. Unless the aperture is a physical one, it may be magnetic by local cancellation of the superconductivity. For example, a vortex as is known in type II superconductors may be inserted in the required place and perform the function of the aperture.

While only two preferred embodiments of the invention have been described it will be readily apparent to those skilled in the art that other modifications and variations may be made therein without departing from the spirit or scope of the invention.

Having thus described my invention, what I claim as new and desire to secure by Letters Patent is:

1. A superconductive device exhibiting multistable states, comprising in combination:
    a superconductor whose internal inductivity can be controlled by application of a magnetic field thereto and having at least one dimension which is comparable to or smaller than the penetration depth of said magnetic field in said superconductor, wherein said superconductor includes two branches over a certain length, said branches having mutual magnetic coupling such that an electrical current in said superconductor of at least a minimum amplitude necessary to cause bistability of said device will flow substantially in only one branch thereof when both branches are in their superconductive state,
    means for producing said magnetic field for controlling the magnitude of said internal inductivity in said superconductor, said means including means for producing a magnetic field which magnetically co-acts with at least one of said branches of said superconductor to control the internal inductivity thereof, said branches remaining in their superconductive states in the presence of said magnetic field, and wherein the branch in which said current substantially flows can be controlled by application of said magnetic field.

2. The device of claim 1, where said means for producing a magnetic field includes at least one electrical current carrying conductor located adjacent to at least one of said branches of said superconductor, said electrical conductor being electrically insulated from said superconductor.

3. The device of claim 2, where said electrical conductor extends in a substantially parallel direction to the direction of current flow through said superconductor.

4. The device of claim 2, where said electrical conductor extends in a direction substantially orthogonal to the direction of current flow through said superconductor.

5. The device of claim 1, wherein the cross-section of one of said branches is larger than the cross-section of the other of said branches.

6. The device of claim 1, wherein said branches of said superconductor extend in directions approximately parallel to each other in the region wherein they magnetically couple to one another.

7. The device of claim 1, wherein said branches extend in directions substantially orthogonal to each other and cross over each other in the region of said mutual magnetic coupling, and further including an electrical current carrying conductor for applying said magnetic field to said device wherein said conductor produces a magnetic field which magnetically co-acts with said device in the region where said branches cross over one another.

8. A plurality of superconductive switches arranged in a matrix, comprising in combination:
    each said switch being comprised of a superconductive material whose internal inductivity is controllable by application of a magnetic field thereto and wherein at least one dimension of said superconductive material is comparable to or smaller than the penetration depth of said magnetic field in said superconductive material, said superconductive material having two branches, said branches having magnetic coupling such that an electrical current in said superconductive material of at least a minimum magnitude necessary to cause bistability of said switch will flow substantially in only one branch thereof when said branches are in their superconductive state,
    means for producing said magnetic field which magnetically co-acts with at least one of said branches to affect the magnitude of said internal inductivity thereof, for determining in which branch substantially all of said electrical current flows.

9. The matrix of claim 8, wherein said means for producing said magnetic field includes at least one current carrying conductor for producing a magnetic field which magnetically couples to at least one of said branches.

10. The matrix of claim 8, wherein each said branch is comprised of the same superconductive material, one of said branches being different in geometry than the other said branch.

11. A superconductive device having multi-states, comprising, in combination:
at least two superconductive switches electrically connected in a parallel circuit, each said switch being comprised of a superconductive material whose internal inductivity is controllable by application of a magnetic field thereto and wherein at least one dimension of said superconductive material is comparable to or smaller than the penetration depth of said magnetic field into said superconductive material, said switches having mutual magnetic coupling such that a current in said parallel circuit having at least a minimum magnitude necessary to cause bistability of said circuit will divide and substantially flow through only one superconductive switch while said switches remain in their superconductive states,
means for producing said magnetic field, said means including further means for applying a magnetic field to each of said superconductive switches for selecting the switch in which said electrical current substantially flows, said switches remaining in their superconductive states when said magnetic field is produced.

12. The device of claim 11, where said means for producing said magnetic field includes at least two electrical current carrying conductors, one of which is within close flux coupling proximity to one of said superconductive switches, while the other is within close flux coupling proximity to the other of said superconductive switches.

13. The device of claim 11, where the geometry of one of said switches is different than the geometry of the other of said switches.

14. The device of claim 12, where said electrical conductors are substantially parallel to the direction of current flow through said superconducting switches.

15. The device of claim 12, where said electrical conductors extend in a direction transverse to the direction of current flow through said superconducting switches.

16. A bistable superconductive device having two stable states, each of which can be produced while the device remains at all times in a superconductive condition, the device comprising in combination:
a superconductive loop circuit having two branches connected in parallel, each of said branches being comprised of a superconductive material,
means for feeding a bias current through said superconductive loop circuit, said bias current having a minimum amplitude sufficient to produce bistability in said device,
means for applying a magnetic field to at least one of said branches of said superconductive loop to alter the internal inductivity of said branch,
wherein said branches are arranged so that the magnetic field produced by current in any branch will couple to the other branch and thereby influence its internal inductivity, at least one lateral dimension of each superconducting branch being comparable to or smaller than the penetration depth of said magnetic field into said branch.

17. The device of claim 16, where said bias current and said magnetic field have values below their critical values in order to maintain said loop in a superconductive state regardless of the bistable state of said device.

* * * * *